US008299541B2

(12) United States Patent
Lenoble et al.

(10) Patent No.: US 8,299,541 B2
(45) Date of Patent: Oct. 30, 2012

(54) PROCESS FOR PRODUCING A CONTACT PAD ON A REGION OF AN INTEGRATED CIRCUIT, IN PARTICULAR ON THE ELECTRODES OF A TRANSISTOR

(75) Inventors: Damien Lenoble, Gieres (FR); Philippe Coronel, Barraux (FR); Robin Cerutti, Grenoble (FR)

(73) Assignees: STMicroelectronics (Crolles 2) SAS, Crolles Cedex (FR); STMicroelectronics S.A., Montrouge (FR)

( * ) Notice: Subject to any disclaimer, the term of this patent is extended or adjusted under 35 U.S.C. 154(b) by 35 days.

(21) Appl. No.: 12/538,723

(22) Filed: Aug. 10, 2009

(65) Prior Publication Data

US 2010/0025773 A1  Feb. 4, 2010

Related U.S. Application Data

(62) Division of application No. 11/250,641, filed on Oct. 14, 2005, now Pat. No. 7,601,634.

(30) Foreign Application Priority Data

Oct. 20, 2004 (FR) .................................. 04 11123

(51) Int. Cl.
    *H01L 21/02* (2006.01)
(52) U.S. Cl. ........ 257/382; 257/288; 257/383; 257/384; 257/E21.431; 257/E21.434
(58) Field of Classification Search ............. 257/288, 257/382–384, E21.431, E21.434
See application file for complete search history.

(56) References Cited

U.S. PATENT DOCUMENTS

| 5,821,158 A | 10/1998 | Shishiguchi |
| 6,271,075 B1 | 8/2001 | Fukui |
| 6,344,675 B1 | 2/2002 | Imai |
| 6,583,052 B2 | 6/2003 | Shin et al. |
| 6,812,577 B2 * | 11/2004 | Lee .................... 257/774 |
| 7,074,713 B2 | 7/2006 | Chen et al. |
| 7,084,025 B2 | 8/2006 | Phua et al. |
| 2001/0039121 A1 | 11/2001 | Gilton et al. |

(Continued)

FOREIGN PATENT DOCUMENTS

JP  58106846 A  6/1983

OTHER PUBLICATIONS

Patent Abstracts of Japan, vol. 007, No. 214 (E-199), Sep. 21, 1983 and JP 58 106846 A (Nippon Denki KK), Jun. 25, 1983.

(Continued)

*Primary Examiner* — Kenneth Parker
*Assistant Examiner* — Jose R Diaz
(74) *Attorney, Agent, or Firm* — Gardere Wynne Sewell LLP

(57) ABSTRACT

A region is locally modified so as to create a zone that extends as far as at least part of the surface of the region and is formed from a material that can be removed selectively with respect to the material of the region. The region is then covered with an insulating material. An orifice is formed in the insulating material emerging at the surface of the zone. The selectively removable material is removed from the zone through the orifice so as to form a cavity in place of the zone. The cavity and the orifice are then filled with at least one electrically conducting material so as to form a contact pad.

25 Claims, 6 Drawing Sheets

U.S. PATENT DOCUMENTS

| | | |
|---|---|---|
| 2004/0147082 A1 | 7/2004 | Kim |
| 2004/0157455 A1 | 8/2004 | Johansson et al. |
| 2005/0212018 A1 | 9/2005 | Schoellkopf et al. |
| 2006/0292779 A1 | 12/2006 | Chen et al. |

OTHER PUBLICATIONS

Gallagher, et al., "A Novel, Borderless Metal-to-Diffusion Contact Technique," Advanced Semiconductor Manufacturing Conference and Workshop, 1995, ASMC 95 Proceedings, IEEE/SEMI 1995, Cambridge, MA, US, Nov. 13-15, 1995, New York, NY, IEEE, US, Nov. 13, 1995, pp. 13-15, XP010153282, ISBN: 0-7803-2713-6.

Krist, et al., "Selective Removal of a SI0.7GE0.3 Layer from SI(100)," Applied Physics Letters, American Institute of Physics, New York, US, vol. 58, No. 17, Apr. 29, 1991, XP000216152, ISSN: 0003-6951.

Preliminary French Search Report, FR 04 11123, dated Jun. 24, 2005.

* cited by examiner

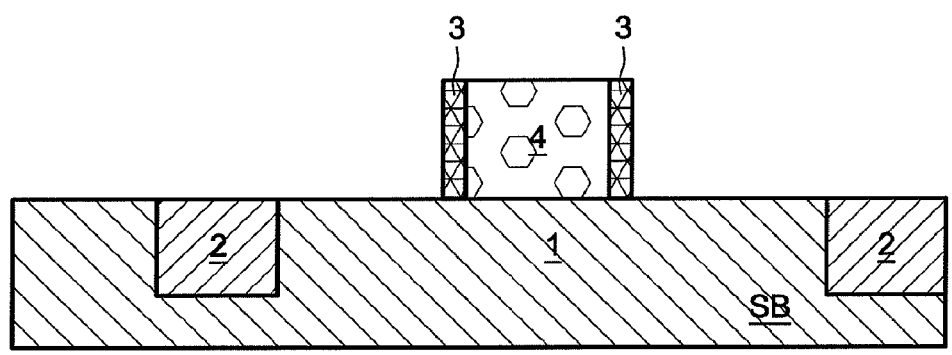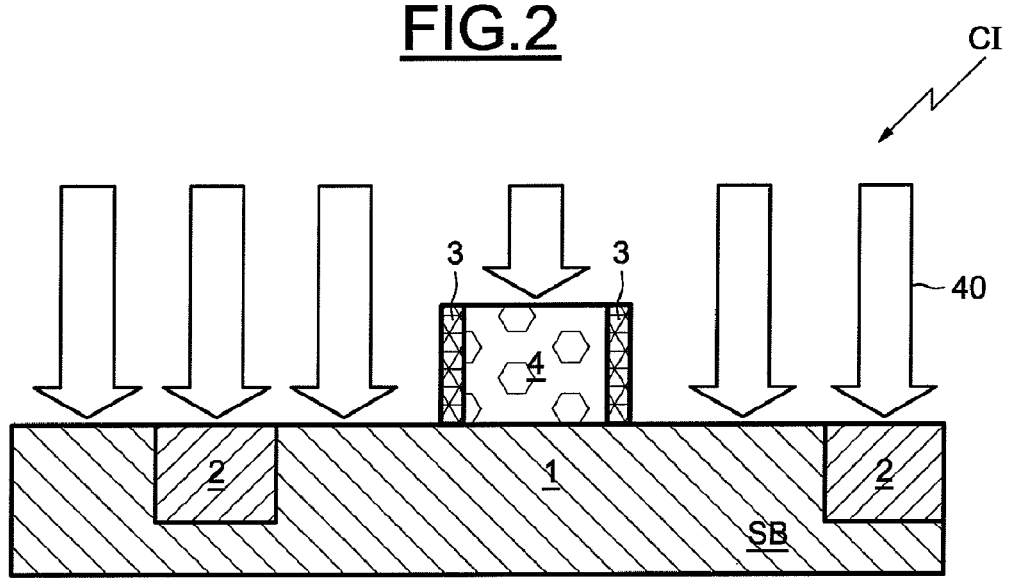

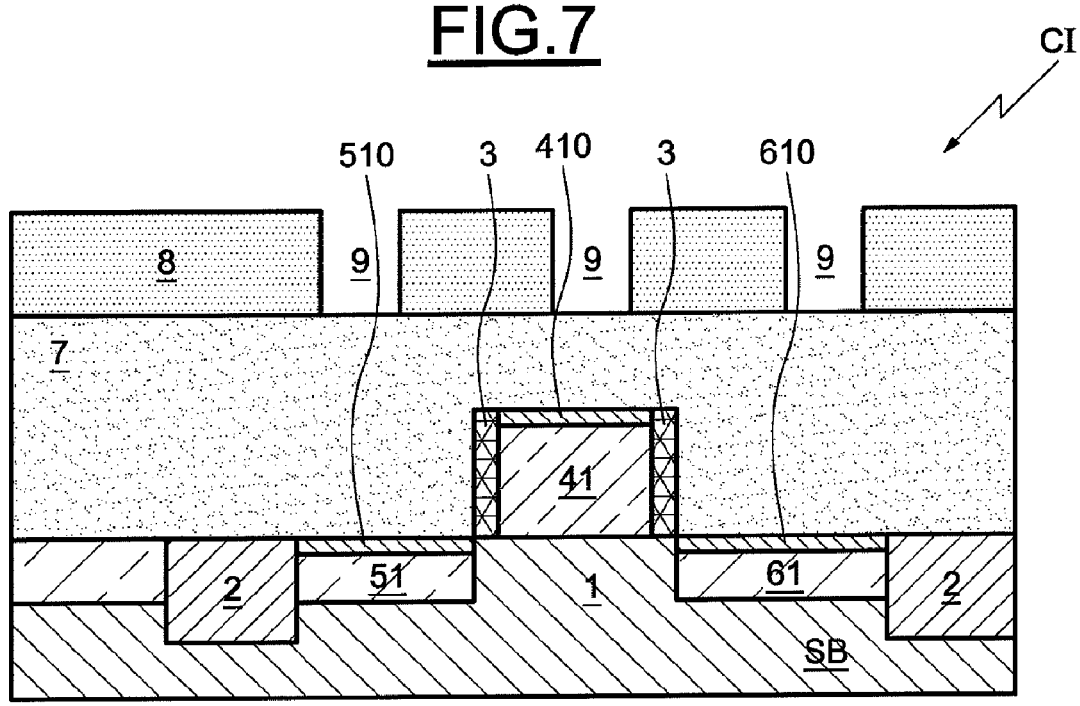
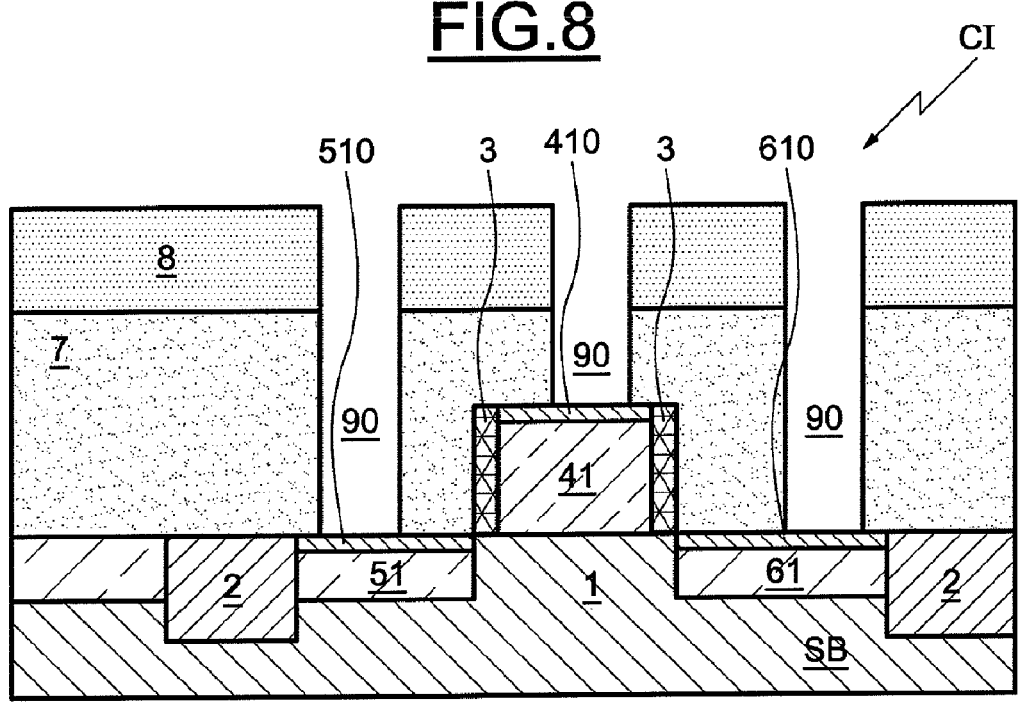

PROCESS FOR PRODUCING A CONTACT PAD ON A REGION OF AN INTEGRATED CIRCUIT, IN PARTICULAR ON THE ELECTRODES OF A TRANSISTOR

PRIORITY CLAIM

This application is a divisional application of U.S. patent application Ser. No. 11/250,641 filed Oct. 14, 2005, which claims priority from French Application for Patent No. 04 11123 filed Oct. 20, 2004, the disclosures of which are hereby incorporated by reference.

BACKGROUND

1. Technical Field

The present invention relates to integrated circuits, especially their fabrication, and more particularly to the production of a contact pad on a region of an integrated circuit.

2. Description of Related Art

At the present time, a contact pad is generally produced on a region of an integrated circuit, for example on the source, drain or gate region of a transistor, or else on a polysilicon line forming a resistor, by silicidation (i.e., the formation of a metal silicide) of the upper part of the region and then, after an insulating material, for example silicon dioxide, has been deposited on the region, by making an opening, commonly called a "via" by those skilled in the art, and filling the via with a metal that will come into contact with the silicided zone. This via will thus allow an electrical connection to be made between the silicided semiconductor region and a metallization level of the integrated circuit.

Such a process has many drawbacks. Among these, mention may for example be made of the complexity and the cost of production, but also the problem of the resistance of the silicide layer and the problem of the interface between the metal silicide and the silicon. This is because, if this interface is not correct this may result in a puncture of the junctions, an increase in the resistance, or even debonding of the metal silicide. The interface between the silicided zone and the metal that fills the via must be perfectly controlled. It is therefore necessary to clean the bottom of a contact after opening the vias, so as to minimize the risks of obtaining an interface of poor quality. Consequently, this further increases the complexity and the production cost.

A need accordingly exists in the art to remedy these drawbacks. A process for producing a contact pad that is radically different from that currently used in the prior art is needed.

There is further a need in the art for a process for producing a contact pad that is extremely simple to carry out, with a very good yield, while in particular dispensing with the step carried out in the prior art of cleaning the bottom of the contact.

There is still further a need in the art for a contact pad having a very low resistance and in any case lower than that obtained in the prior art by silicidation.

There is also a need in the art to decrease the contact resistance without increasing the aperture of the via in order to maintain the integration density of the interconnections.

SUMMARY

According to one aspect, what is proposed is a process for producing at least one contact pad on the at least one region of an integrated circuit, in which the region is locally modified so as to create a zone that extends as far as at least part of the surface of the region, this zone being formed from a material that can be removed selectively with respect to the material of the region. The region is covered with an insulating material and an orifice emerging at the surface of the zone is formed in the insulating material. The selectively removable material is removed from the zone through the orifice so as to form a cavity instead of the zone. The cavity and the orifice are filled with at least one electrically conducting material, for example a metallic material. Thus, for example, it is possible to obtain an entirely metallic contact pad on the region.

According to this aspect, what is thus provided is in particular the simultaneous production, on the semiconductor region of the integrated circuit, of a metallization and of the interconnection via for connecting this metallization to a higher metallization level of the integrated circuit. This is particularly simple to carry out, for little cost. The yields are very good as there is a very large choice of electrically conducting materials and temperatures. In this regard, it is possible to envisage, without limitation, filling the cavity and the etching orifice with one and the same metal, but also with several other, different metals or metallic compounds, or else with one or more metal oxides, such as for example an indium oxide, such as that known by those skilled in the art by the term ITO (Indium Tin Oxide).

Moreover, the problem of cleaning the bottom of the contact after opening of the vias poses no problem here since, according to one method of implementing, the removal of a layer of selectively removable material is provided, and therefore the interface thus obtained is virtually perfect.

Moreover, the metallized layer located on the surface of the region on which the contact pad is made may have a very low resistance, and in any case lower than that of a metal silicide.

Moreover, the thickness of this metallized layer can be perfectly determined and can be easily adjusted depending on the intended application.

Furthermore, the metallization is carried out at an instant late in the process for fabricating the components on which it is necessary to produce a metal contact. Consequently, the thermal budget is lower. The surface junctions may be produced over a very small depth because the thermal budget is low and because the metallization of the junction may be carried out over a very small thickness.

Moreover according to a particularly advantageous embodiment, the aperture of the cavity is bigger than that of the orifice, which permits to increase the area of the electrically conducting contact (i.e., the zone filled with the electrically conducting material) and consequently to decrease the contact resistance without increasing the dimensions of the via, i.e., those of the orifice. And this is possible because the definition of the location and the dimensions of the cavity is performed before the etching of the orifice and because the actual formation of the cavity is performed after said etching and through the etched orifice.

This applies in particularly to contact pads on regions of active components, such as transistors, or passive components, such as resistors, for example resistive lines made of polysilicon. This thus makes it possible in particular to reduce the resistances for access to all kinds of devices, in particular bipolar transistors.

This may also apply to any element, whether passive or active, of an integrated circuit on which it is necessary to have a contact pad.

The thickness of the zone resulting from the local modification of the region may have any thickness, which a person skilled in the art will know how to choose depending on the envisaged application. This being the case, it is particularly advantageous for the zone to be a very thin surface zone, which is easily made possible by a method of implementing the process. In this regard, the thickness of the surface zone is for example less than 50 nm.

The material of the region on which it is desired to make the contact pad is for example a silicon-based material, for example single-crystal silicon or polycrystalline silicon. In this case, the selectively removable material may be a silicon-germanium alloy.

For example, the zone is formed by the implantation of dopants, for example by implantation of germanium, it being possible, for example, for this implantation to be localized by masking with a resist, or else to be self-aligned with respect to a pre-existing feature of an integrated circuit. It would also be possible in certain cases to implant oxygen or nitrogen.

The orifice may be formed in the insulating material by chemical or plasma etching.

According to one method of implementation, the material is removed from the zone by selective etching.

In certain cases, the entire surface of the region may be metallized. In other words, according to such a method of implementation, the zone extends over the entire surface of the region. The region may be a source, drain or gate region of a field-effect transistor, or an emitter, collector or base region of a bipolar transistor. When the foregoing is applied to the fabrication of an MOS transistor, this fabrication comprises, according to one method of implementation: a) the formation of the gate, source and drain regions of the transistor; and b) the simultaneous production of the respective metal contact pads on the source and drain regions as defined above. The insulating material, in which the orifices emerging in the source and drain regions are formed, then covers the structure obtained in step a).

Thus, it is possible to obtain, according to one method of implementing, metallizations that are self-aligned with respect to the source and drain regions of the MOS transistor and to do so without any problem of short-circuiting the subjacent junctions.

It is also possible to produce the metallization and the metal contact pad on the gate region simultaneously.

Thus, in the case of an MOS transistor for example, it is noteworthy that the source, drain and gate metallizations and the vias that interconnect these metallizations to the upper metallization level of the integrated circuit are produced simultaneously and in a self-aligned manner.

Another aspect is an integrated circuit comprising at least one region equipped with an entirely metallic contact pad obtained by the process as defined above.

This region may form part of a passive or active component.

This component may thus be a resistor formed from a polysilicon line or else a transistor obtained by a fabrication process as defined above.

In accordance with an embodiment, an integrated circuit comprises a silicon-based region on the surface of which was formed and removed a sacrificial alloyed silicon region so to define a cavity. An insulating layer overlies the silicon-based region, the insulating layer including an opening therein aligned with the cavity on the surface of the silicon-based region. A metallic material fills both the opening in the insulating layer and the cavity on the surface of the silicon-based region so as to form a contact pad with that silicon-based region.

BRIEF DESCRIPTION OF THE DRAWINGS

A more complete understanding of the method and apparatus of the present invention may be acquired by reference to the following Detailed Description when taken in conjunction with the accompanying Drawings wherein:

FIGS. 1 to 10 illustrate schematically the main steps of one method of implementing the process according to an embodiment;

DETAILED DESCRIPTION OF THE DRAWINGS

Figure 3:
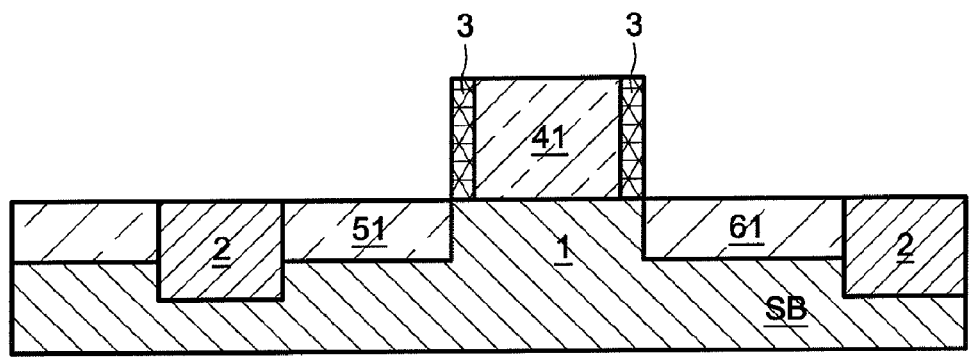

The main steps of one method of implementing the process will now be described in greater detail.

In FIG. 1, an active zone 1 is formed between two isolation zones 2 on a substrate SB, for example a silicon substrate, it being possible for the isolation zones to be isolation trenches. These isolation trenches may for example be deep trenches of the DTI (Deep Trench Isolation) type or shallow trenches of the STI (Shallow Trench Isolation) type.

An initial gate region 4, which may also be made of polysilicon, is produced by means known per se on the active region 1.

Next, the source and drain regions are produced (FIG. 2). These are produced, for example, by carrying out two implantations 40 of dopants respectively before and after the formation of spacers 3 surrounding the gate. The nature of the dopants is chosen depending on whether the transistor on the circuit IC is of the n type or p type. Since the initial gate 4 acts as a mask for the ion implantations, source and drain regions that are self-aligned with the initial gate region 4 and with the active zone 1 bounded by the isolation regions 2 are obtained.

Dopants are also implanted into the gate.

These various implantations make it possible to produce, as illustrated in FIG. 3, a diffused source region 51, a diffused drain region 61 and a diffused gate region 41. Of course, it should also be noted that the gate of the transistor is in this case an isolated gate, separated from the substrate 1 by a gate oxide, this oxide not being shown for the purpose of simplification.

Figure 4:
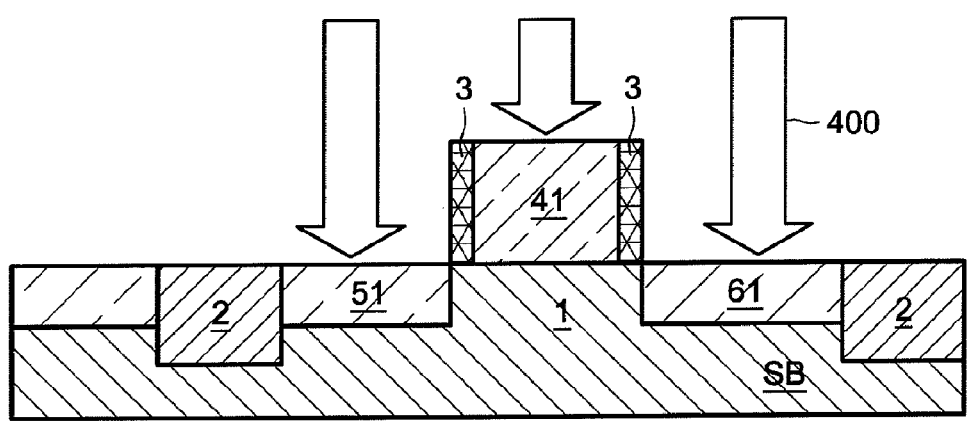

For example, a germanium implantation 400 is then carried out in the integrated circuit IC (FIG. 4). This is accordingly a "full sheet" implantation. It will be recognized that a localized implantation of the dopant could alternatively be provided.

Figure 5:
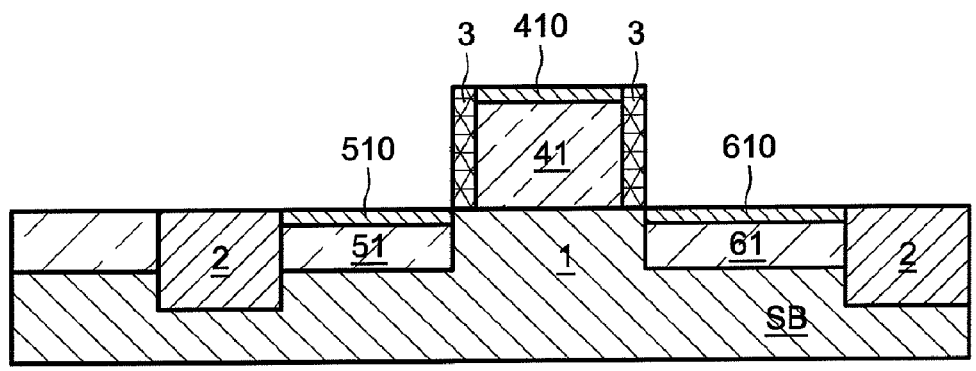

As illustrated in FIG. 5, the energy of this implantation 400 is chosen so as to form surface zones 410, 510 and 610 in the respective regions 41, 51 and 61. These surface zones 410, 510 and 610 are then formed from a material that can be selectively removed with respect to the silicon forming the regions 41, 51 and 61. More precisely, in the present case, these zones 410, 510 and 610 are formed from a silicon-germanium alloy SiGe.

An annealing step may furthermore be carried out so as to recrystallize the materials and thus better define the boundaries between the material forming the regions 51, 61 and 41 and the selectively removable material in the source zones 510, 610 and 410. This annealing may for example be carried out at a temperature of 800 to 900° C.

Figure 6:
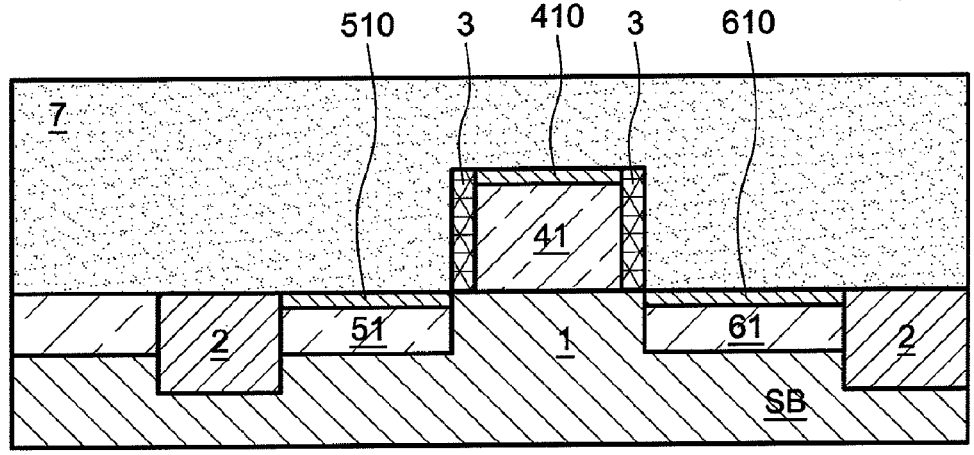

The surface of the circuit is then covered by known means with a layer of an insulating material 7, the layer 7 consisting for example of silicon dioxide (FIG. 6). This layer 7 is surmounted by a resist layer 8 (FIG. 7), also obtained by known means, in which orifices 9, that will form the position 9 of the future connection vias, are formed in a known manner.

Next, the insulating material 7 is anisotropically etched through the orifices 9 in the resist mask so as to obtain etching orifices 90 that extend down to the source zone 510, the drain zone 610 and the gate zone 410 (FIG. 8).

Figure 9:
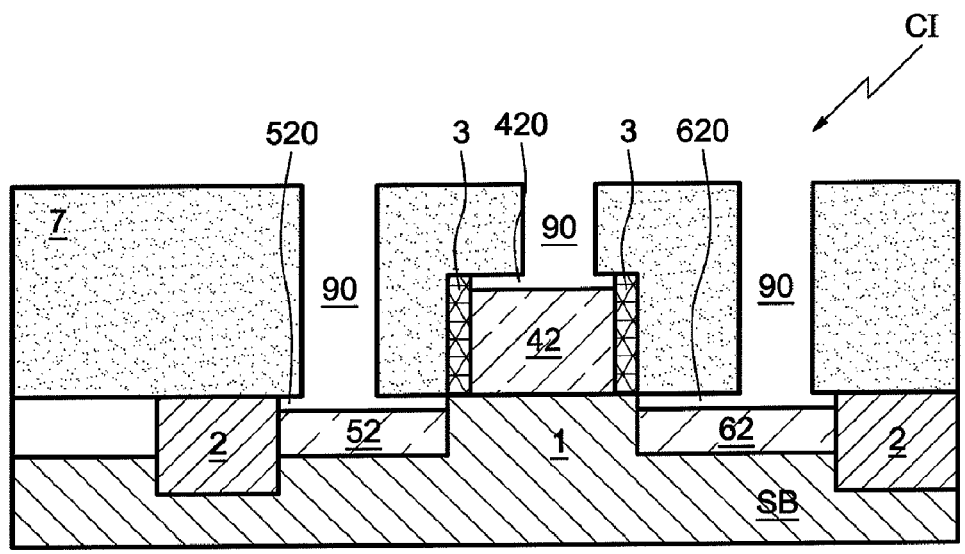

It is through the orifices 90 that the selectively removable material, present in the zones 510, 610 and 410, is selectively removed (FIG. 9) in order to obtain cavities 520, 620 and 420 surmounting the diffused source region 52, drain region 62 and gate region 42.

It is noted here that the dimension of the cavities is greater than the aperture of the orifice.

This selective removal may be carried out by any known means, for example by means of an oxidizing chemical agent such as a solution comprising 40 ml of 70% $HNO_3$+20 ml of $H_2O_2$+5 ml of 0.5% HF, or by isotropic plasma etching.

Figure 10:
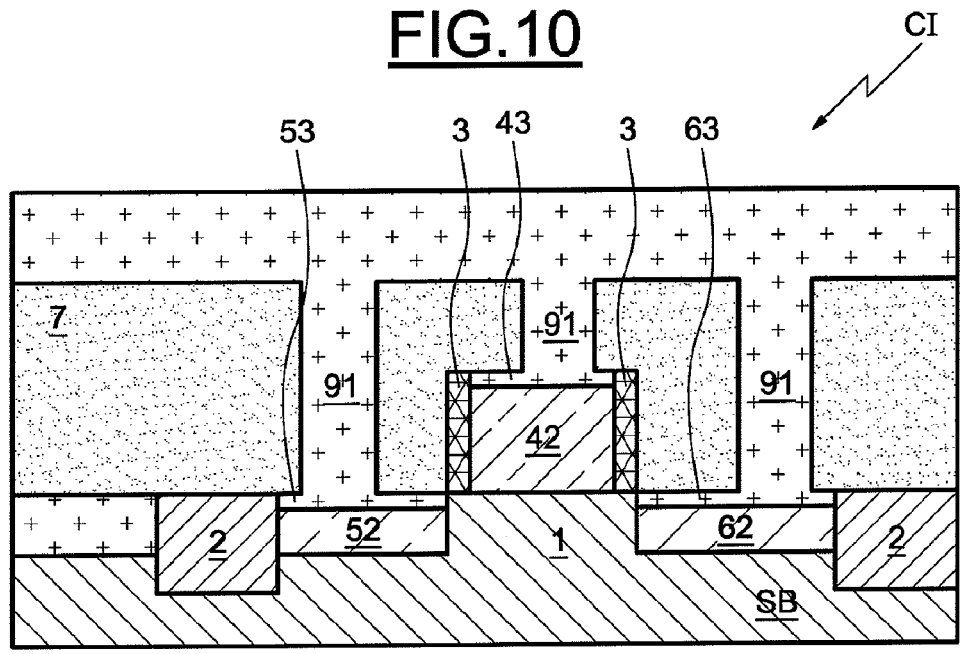

Next, one or more electrically conducting materials are deposited by known methods, allowing the previously obtained cavities to be simultaneously filled (FIG. 10) in order to obtain the source region 52, the drain region 62 and the gate region 42, these regions being surmounted by electrically conducting zones, for example metallizations 53, 63 and 43 and connection vias 91, which are also electrically conducting, between these metallizations and the surface of the integrated circuit.

Since the aperture of the cavities is greater than that of the orifices, the areas of the metallizations 43, 53, 63 are greater than the vias aperture. This permits a decrease in the contact resistance without increasing the lateral dimensions of the vias, which permits one to maintain the integration density of the interconnections.

In this regard, the cavities 420, 520, 620 and the etching orifices 90 may be filled with tungsten (W), for example by chemical vapor deposition (CVD) known per se, for example within the 500° C. to 600° C. temperature range, or else by ALD (Atomic Layer Deposition), also known per se, for example within the 200° C. to 300° C. temperature range.

It is also possible to use copper (Cu), cobalt (Co) or nickel (Ni) by electrochemical deposition at room temperature. In particular in the case of copper, this is preferably deposited prior to a barrier layer, for example made of titanium nitride (TiN), by chemical vapor deposition, or made of tantalum (Ta).

It is also possible to use tantalum nitride (TaN) by ALD-type deposition, for example within the 200° C. to 300° C. temperature range.

It is also possible to use highly doped polysilicon by LPCVD (low-pressure CVD) in a furnace, for example at between 700° C. and 800° C., or else ALD-type deposition, for example within the 200° C. to 300° C. temperature range.

It is also possible to use a metal compound comprising aluminum (Al) and a small percentage, for example 5%, of silicon.

It is also possible to use metal oxides, such as for example an indium oxide, such as the one known by the name ITO (Indium Tin Oxide).

Figure 11:
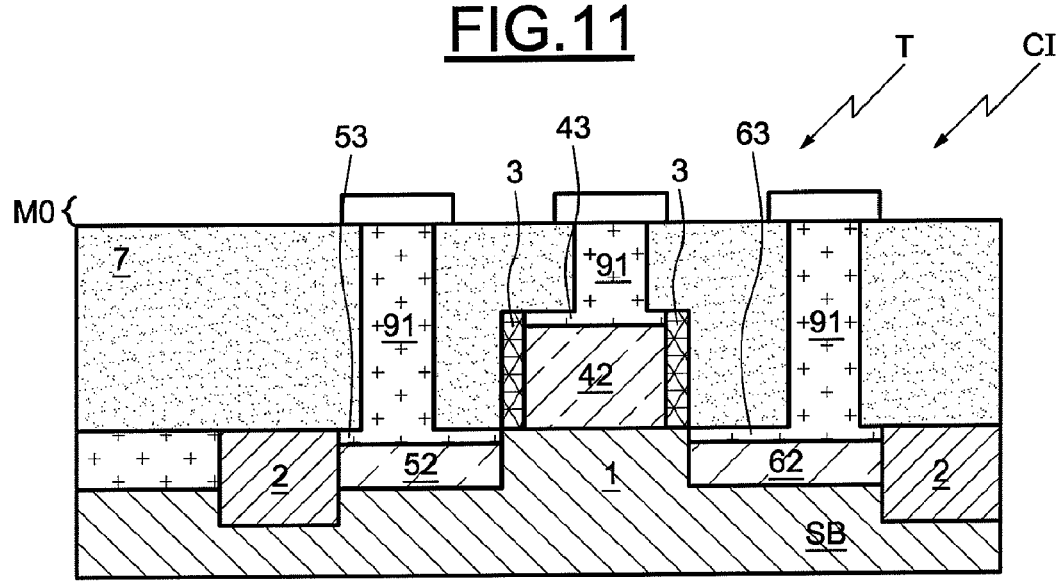
FIG. 11 shows schematically a transistor obtained by such a method of implementation, within an integrated circuit.

The excess metal is removed for example by chemical-mechanical polishing, and a metallization level M0 is produced, by known means, in order to obtain the integrated circuit of FIG. 11.

FIG. 11 therefore shows an integrated circuit IC comprising a transistor according to one embodiment.

The integrated circuit comprises a substrate SB in which the active zones 1 have been produced between the isolation zones 2 of the substrate. A transistor T has been produced in and on the active zone 1 of the substrate SB. The electrodes (source 52, drain 62 and gate 42) of the transistor are covered with electrically conducting contact pads, these being for example entirely metallic and formed from surface metallizations 52, 63 and 43 and from metal vias 91 connected to the metallization level M0.

Figure 12:
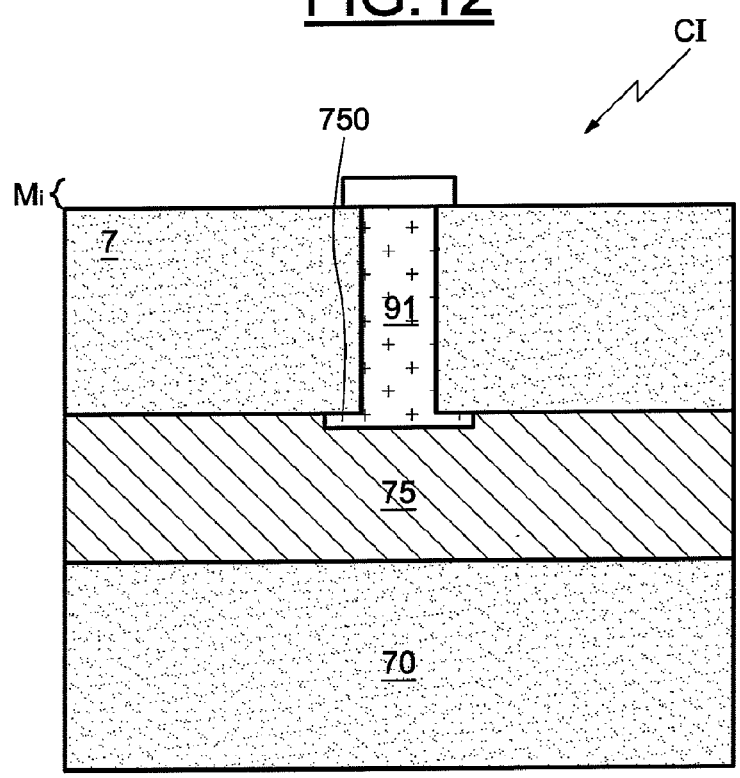
FIG. 12 illustrates schematically another component of an integrated circuit equipped with a contact pad according to one embodiment.

The invention is not limited to the production of self-aligned contact pads on a transistor, rather it applies to any passive or active component of an integrated circuit on which it is necessary to make a contact pad, whether or not self-aligned. By way of indication, FIG. 12 illustrates schematically a polysilicon line 75, forming a resistor, on which an entirely metallic contact pad is produced, for example in accordance with the method of implementation described above.

More precisely, this polysilicon resistive line 75, resting for example on a subjacent insulating material 70, is provided locally with an entirely metallic contact pad. This contact pad comprises, as explained above, a metallic surface zone 750 and a metallic interconnection via 91 made within an upper insulating material 7. The via 91 makes it possible to electrically connect the metallization 750 for the resistor 75 to the upper metallization level Mi of the integrated circuit. The metallic surface zone is obtained using the above method of implementation, for example by germanium implantation localized by a resist mask.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. An integrated circuit, comprising:
   a silicon-based region extending from a first peripheral edge to a second peripheral edge, said second peripheral edge coincident with an edge of a laterally adjacent insulating material, wherein a surface of said silicon-based region includes a cavity which laterally extends out to an edge that is also coincident with said second peripheral edge of the silicon-based region;
   a insulating layer overlying the silicon-based region, the insulating layer including an opening therein aligned with the cavity on the surface of the silicon-based region; and
   a metallic material that at least partially fills both the opening in the insulating layer and the cavity on the surface of the silicon-based region so as to form a contact pad with that silicon-based region which laterally extends out to said second peripheral edge of the silicon-based region.

2. The circuit according to claim 1, wherein the silicon-based region forms part of a passive or active component.

3. The circuit according to claim 1, wherein silicon-based region is a portion of a polysilicon line.

4. The circuit according to claim 1, wherein the silicon-based region is a portion of a transistor, wherein the portion is a conductive gate of the transistor, and wherein the laterally adjacent insulating material is a transistor gate spacer.

5. The circuit according to claim 1, wherein the silicon-based region is a portion of a transistor, and wherein the portion is one of a source or drain of the transistor, and wherein the laterally adjacent insulating material is a trench isolation structure.

6. The circuit according to claim 1, wherein an aperture of the cavity is larger than an aperture of the opening.

7. An integrated circuit, comprising:
a silicon-based region extending from a first peripheral edge to a second peripheral edge, said second peripheral edge coincident with an edge of an insulating material;
a insulating layer overlying the silicon-based region;
a cavity positioned between the silicon-based region and the overlying insulating layer, wherein said cavity laterally extends out to a peripheral edge coinciding with at least one of said second peripheral edge of the silicon-based region;
the insulating layer including an opening therein aligned with the cavity; and
a metallic material that at least partially fills both the opening in the insulating layer and the cavity so as to form a pad in contact with that silicon-based region, said pad laterally extending out to said second peripheral edge of the silicon-based region.

8. The circuit according to claim 7, wherein the silicon-based region forms part of a passive or active component.

9. The circuit according to claim 7, wherein silicon-based region is a portion of a polysilicon line and the metallic material forms the pad in contact with the polysilicon line.

10. The circuit according to claim 7, wherein silicon-based region is a portion of a transistor and the metallic material forms the pad in contact with the portion of the transistor, and wherein the insulating material is a transistor gate spacer.

11. The circuit according to claim 7, wherein the silicon-based region is a portion of a transistor and the metallic material forms the pad in contact with to the portion of the transistor, and wherein the insulating material is a trench isolation structure.

12. The circuit according to claim 7, wherein an aperture of the cavity is larger than an aperture of the opening.

13. Apparatus, comprising:
a conductive substrate including a source or drain region for an integrated circuit transistor, wherein the source or drain region laterally extends out to an edge that coincides with an edge of a laterally adjacent isolation structure formed in the conductive substrate;
an insulating material covering the conductive substrate and including an orifice in the insulating material above the source or drain region of the conductive substrate;
wherein the conductive substrate further includes a cavity formed in the conductive substrate below the orifice in the insulating material, the cavity being within the source or drain region of the conductive substrate and the cavity laterally extending out to said edge that coincides with the edge of the laterally adjacent isolation structure; and
at least one electrically conducting material at least partially filling the cavity in the conductive substrate and the orifice in the insulating material to form a source or drain contact which laterally extends out to said edge that coincides with the edge of the laterally adjacent isolation structure.

14. The apparatus according to claim 13, wherein the cavity is a substrate surface cavity having a thickness of less than 50 nm.

15. The apparatus according to claim 13, wherein the material of the source or drain region is a silicon-based material, such as single-crystal silicon or polycrystalline silicon.

16. The apparatus according to claim 14, wherein an aperture of the cavity is larger than an aperture of the orifice.

17. Apparatus, comprising:
a conductive substrate including an emitter, base or collector region for an integrated circuit transistor, wherein at least one of the emitter, base or collector region laterally extends out
to an edge that coincides with an edge of a laterally adjacent isolation structure;
an insulating material covering the conductive substrate region and including an orifice in the insulating material above said at least one of the emitter, base or collector region of the conductive substrate;
wherein the conductive substrate further includes a cavity formed in the conductive substrate below the orifice in the insulating material, the cavity being within said at least one of the emitter, base or collector region of the conductive substrate and the cavity laterally extending out to said edge that coincides with the edge of the laterally adjacent isolation structure; and
at least one electrically conducting material at least partially filling the cavity in the conductive substrate and the orifice in the insulating material to form one of an emitter, base or collector contact which laterally extends out to said edge that coincides with the edge of the laterally adjacent isolation structure.

18. The apparatus according to claim 17, wherein the cavity is a substrate surface cavity having a thickness of less than 50 nm.

19. The apparatus according to claim 17, wherein the material of the emitter, base or collector region is a silicon-based material, such as single-crystal silicon or polycrystalline silicon.

20. The apparatus according to claim 17, wherein an aperture of the cavity is larger than an aperture of the orifice.

21. Apparatus, comprising:
a first insulating layer;
a polysilicon transistor gate extending over the first insulating layer from a first edge in contact with a side spacer to a second edge in contact with the side spacer;
a second insulating layer over the polysilicon transistor gate and including an orifice in the second insulating layer above the polysilicon transistor gate;
wherein the polysilicon transistor gate further includes a cavity formed in the polysilicon transistor gate below the orifice in the second insulating layer, the cavity laterally extending from said side spacer at the first edge of the polysilicon transistor gate to the side spacer at the second edge of the polysilicon transistor gate; and
at least one electrically conducting material at least partially filling the cavity in the polysilicon transistor gate and the orifice in the insulating material to form a gate contact with the polysilicon transistor gate which laterally extends from said first edge to said second edge.

22. The apparatus according to claim 21, wherein the cavity is a polysilicon transistor gate surface cavity having a thickness of less than 50 nm.

23. The apparatus according to claim 21, wherein an aperture of the cavity is larger than an aperture of the orifice.

24. An integrated circuit, comprising:
a silicon-based region on a surface of which was formed and removed a sacrificial alloyed silicon region that extended out to an edge of the silicon-based region so to define a cavity which laterally extends out to said edge of the silicon-based region;
a insulating layer overlying the silicon-based region, the insulating layer including an opening therein aligned with the cavity on the surface of the silicon-based region; and a metallic material that at least partially fills both the opening in the insulating layer and the cavity on the surface of the silicon-based region so as to form a contact pad with that silicon-based region which laterally extends out to said edge of the silicon-based region;

wherein the silicon-based region is a portion of a transistor, and wherein the portion is one of a source or drain of the transistor, and wherein the lateral extension of the contact pad for the source or drain extends from an inner edge, the inner edge being coincident with an outer edge of a spacer surrounding a gate of the transistor, to an outer edge, the outer edge being coincident with an outer edge of the silicon based region.

25. An integrated circuit, comprising:
a silicon-based region;
a insulating layer overlying the silicon-based region;
a cavity positioned between the silicon-based region and the overlying insulating layer;
the insulating layer including an opening therein aligned with the cavity; and
a metallic material that at least partially fills both the opening in the insulating layer and the cavity so as to form a pad in contact with that silicon-based region;

wherein the silicon-based region is a portion of a transistor and the metallic material forms the pad in contact with to the portion of the transistor, and wherein the portion is one of a source or drain of the transistor, and wherein the pad for the source or drain extends from an inner edge, the inner edge being coincident with an outer edge of a spacer surrounding a gate of the transistor, to an outer edge, the outer edge being coincident with an outer edge of the silicon based region.

* * * * *